United States Patent
Jun et al.

(10) Patent No.: US 6,582,987 B2
(45) Date of Patent: Jun. 24, 2003

(54) METHOD OF FABRICATING MICROCHANNEL ARRAY STRUCTURE EMBEDDED IN SILICON SUBSTRATE

(75) Inventors: Chi Hoon Jun, Daejeon (KR); Chang Auck Choi, Daejeon (KR); Youn Tae Kim, Daejeon (KR)

(73) Assignee: Electronics and Telecommunications Research Institute (KR)

( * ) Notice: Subject to any disclaimer, the term of this patent is extended or adjusted under 35 U.S.C. 154(b) by 0 days.

(21) Appl. No.: 10/022,093

(22) Filed: Dec. 14, 2001

(65) Prior Publication Data

US 2002/0084510 A1 Jul. 4, 2002

Related U.S. Application Data

(60) Provisional application No. 60/327,574, filed on Sep. 28, 2001.

(30) Foreign Application Priority Data

Dec. 30, 2000 (KR) ........................................ 2000-86723

(51) Int. Cl.$^7$ ............................................... H01L 21/00
(52) U.S. Cl. ....................................................... 438/49
(58) Field of Search .................. 438/49, 947, FOR 438; 216/2

(56) References Cited

U.S. PATENT DOCUMENTS

| | | | |
|---|---|---|---|
| 5,205,902 A | * 4/1993 | Horton et al. | 216/48 |
| 5,426,070 A | * 6/1995 | Shaw et al. | 216/2 |
| 5,569,355 A | * 10/1996 | Then et al. | 216/24 |
| 6,136,212 A | 10/2000 | Mastrangelo et al. | |
| 6,136,630 A | * 10/2000 | Weigold et al. | 438/48 |
| 6,342,427 B1 | * 1/2002 | Choi et al. | 216/2 |
| 2002/0115225 A1 | * 3/2002 | Wagner et al. | 436/518 |

OTHER PUBLICATIONS

Wolf S. "Silicon Processing for the VLSI–ERA: vol. 1—Process Technology", 1986, Lattice Pr., vol. 1, p. 200–201.*

High performance liquid cooled aluminium nitride heat sinks Hahn et al, Microelectronics International 16(1(1999) 21–26.

Mems based micro–fluidic system for chromatographic analysis of liquid samples Golubouic et al, SPIE Conference on Microfluidic Devices and Systems Sep. 1998.

* cited by examiner

Primary Examiner—George Fourson
Assistant Examiner—Suk San Foong
(74) Attorney, Agent, or Firm—Blakely Sokoloff Taylor & Zafman

(57) ABSTRACT

The present invention is disclosed a microchannel array structure embedded in a silicon substrate and a fabrication method thereof. The microchannel array structure of the present invention is formed deep inside the substrate and has high-density microscopic micro-channels. Besides, going through surface micromachining, physical and chemical properties of the silicon substrate are hardly influenced by the fabrication procedures. With microchannels buried in the substrate, the top of a microchannel array structure becomes flat, minimizing the effect of step height. That way, additional devices such as passive components, micro sensors, micro actuators and electronic devices can be easily integrated onto the microchannel array structure. The microchannel array structure of the present invention can be employed as a basic fluidic platform for miniaturizing and improving perfomances of electronic device coolers as well as such fluidic micro-electro-mechanical system (MEMS) devices as biochips, microfluidic components and chemical analyzers, lab-on-a-chips, polymerase chain reaction (PCR) amplifiers, micro reactors and drug delivery systems.

5 Claims, 7 Drawing Sheets

METHOD OF FABRICATING MICROCHANNEL ARRAY STRUCTURE EMBEDDED IN SILICON SUBSTRATE

This is a non-provisional application claiming the benefit of provisional application Ser. No. 60/327,574 filed Sep. 28, 2001.

FIELD OF THE INVENTION

The present invention relates to a microchannel array structure embedded in a silicon substrate and a fabrication method thereof; and, more particularly, to a structure of high-density ultra fine microchannel array buried deep in a silicon substrate by silicon surface micromachining using semiconductor batch processing.

DESCRIPTION OF THE PRIOR ART

Contrived for the development of physical and chemical micro sensors and mechanical driving elements such as micro actuators, the MEMS technology is expanding its applicable range day by day up to RLC passive components, RF and microwave devices, flat panel displays and core optical components for telecommunication, as highly integrated semiconductor technology deploys. These days, researchers vigorously get down on a study of fluidic MEMS technologies that can miniaturize conventional analyzers and improve their performance using microfluidics for DNA sequencing, research of protein functions, measuring of a very small amount of metabolic substances or reagents, especially in the areas of bio-engineering, genetic engineering, clinical diagnostics and the development of new medicines. Among the fluidic MEMS technologies is a lab-on-a-chip, which is being developed as a microfluidic platform for systemizing and integrating bio-chips such as DNA chips, protein chips, immuno-assays and the like. These devices are formed based on a plurality of microchannel structures such as microfluidic networks, as they conduct functions of separation, extraction, filtration, mixing and transport of reagents, liquids, or minute particles, making use of the principle of electrophoresis or dielectrophoresis with the aid of microelectrodes. In the meantime, additional high-performance micro heaters are required for the embodiment of micro PCR (polymerase chain reaction) amplifiers, micro reactors and so forth. Microchannel structures are used to interconnect microfluidic components, e.g., micro pumps, micro valves, micro sensors in micro total analysis systems, drug delivery systems, HPLC (high performance liquid chromatography), etc., or used as separation columns as well as heat sinks and heat exchangers that cool down electronic components such as CPUs, infrared sensors, high power semiconductor lasers.

Microchannels with as many uses as mentioned above are usually fabricated by bulk micromachining, polymer-based micromachining, or surface micromachining. The bulk micromachining method mainly focuses on bonding and wet etching of a substrate itself, while surface micromachining features a technique of deposition or dry etching of thin layers on the top of a substrate.

For instance, microchannels are fabricated by locally processing a silicon, glass or quartz substrate with an etching solution, dry etching, or laser cutting, forming channel patterns, and is hermetically sealed by attaching another substrate thereto by anodic or fusion bonding, diffusion bonding or soldering. Another method of making microchannels are to form channel patterns by coating a thick polymer layer on the top of a substrate; radiating it with UV light; attaching another substrate to the top of the channels, or coating a polymer layer again on the formed channel patterns; then doing patterning of etch holes; and then removing the sacrificial polymer layer below the final polymer layer. Also, a microchannel can be fabricated by using a sacrificial oxide or photoresist layer. The sacrificial layer is filled up in the region where channels will be formed. A microchannel outer wall is deposited or electroplated on the top of the sacrificial layer, and then the sacrificial layer is removed by an etching solution. It's also possible to make microchannels by patterning a thin masking film in slot shapes on the top of a substrate, anisotropically etching the substrate with an etching solution, thus forming channel patterns. Then, a thin layer is deposited on the entrances to hermetically seal up the channels.

As another substrate is to be attached to a thick polymer film or to a substrate where channel patterns are etched, the conventional methods seen above have problems of generating pores on the interface, so they are not appropriate to be applied to the fabrication of ultra fine microchannels whose width is less than tens of $\mu$m, because it's hard to control the channel size. Using two substrates, the manufacturing process is complex with narrow choice in selecting channel materials. Also, it's hard to form such additional structures as micro sensors, micro actuators, passive elements and electronic devices on the top of a substrate. In case when a sacrificial layer is deposited or coated on a silicon substrate, the channel has a limitation on its height, thereby affecting the following step of photolithography, because it's difficult to deposit the sacrificial layer thick more than a few $\mu$m in CMOS semiconductor processes. The problem of the conventional method in forming channels inside a substrate is that the channel shape depends on the etching rate of the substrate you choose, and the width of channels is relatively as big as tens of $\mu$m.

Putting an importance on the fabrication of a single or a few microchannels, the above methods have never been applied to the fabrication of ultra fine microchannels or microchannel arrays by using semiconductor processes and the integration of additional device structures thereby.

SUMMARY OF THE INVENTION

It is, therefore, an object of the present invention to provide a high-density ultra fine microchannel array structure embedded in a silicon substrate with a channel whose size is as fine as less than tens of $\mu$m, preferably less than a few $\mu$m, and a fabrication method thereof.

It is another object of the present invention to provide a microchannel array structure embedded in a silicon substrate, which can be fabricated by simple, semiconductor batch processing with a wide choice of selecting channel materials as well as the capability of forming additional structures such as micro sensors, micro actuators, passive components, electronic devices on the top of microchannels just by integrated semiconductor fabrication processing, and a fabrication method thereof.

It is further another object of the present invention to provide a microchannel array structure embedded in a silicon substrate with deep channel depth, minimizing the step height of the upper part of channel patterns so that the micro channel array structure can hardly affect later fabrication procedures.

To achieve the purposes above, the present invention provides a high-density ultra fine microchannel array structure with a planar surface embedded in a silicon substrate by surface micromachining using semiconductor batch processing, and a method of integrating a high-performance micro heater or a micro electrode integrated on the top of the microchannel array structure.

In accordance with the present invention, there is provided a method of fabricating a microchannel array structure, further including the steps of: a) forming a micro heater or a micro electrode by locally doping impurities into the top surface of the microchannel outer wall, or by depositing and etching an additional thin layer on the outer wall after the microchannel outer wall is formed; and b) forming electrical pads by depositing and etching a metal layer on the micro heater or the micro electrode.

In accordance with the present invention, there is provided a microchannel array formed with a plurality of microchannels, of which the planar structure shapes like a slot or an isolated column, and cross-sections of which shape like squares, rounds, hemicycles, lozenges, trapezoids, triangles, hexagon and so forth.

In accordance with the present invention, there is provided a microchannel array formed with highly integrated ultra fine microchannels whose sectional width, or diameter, is $10^{-1} \sim 10^0$ μm long.

In accordance with the present invention, there is provided a microchannel array region has a sectional width, or diameter, of $10^0 \sim 10^3$ μm.

In accordance with the present invention, there is provided a microchannel outer wall formed out of polysilicon, amorphous or single-crystal silicon, conductors, insulators, or semiconductors.

In accordance with the present invention, there is provided a micro heater formed out of polysilicon, amorphous or single-crystal silicon layers, conducting layers, or semiconductor layers, otherwise, there is provided a micro electrode formed out of polysilicons, amorphous or single-crystal silicon layers, conducting layers, or semiconductor layers.

BRIEF DESCRIPTION OF DRAWINGS

The above and other objects and features of the present invention will become apparent from the following description of the preferred embodiments given in conjunction with the accompanying drawings, in which.

DETAILED DESCRIPTION OF THE INVENTION

Figure 1A:
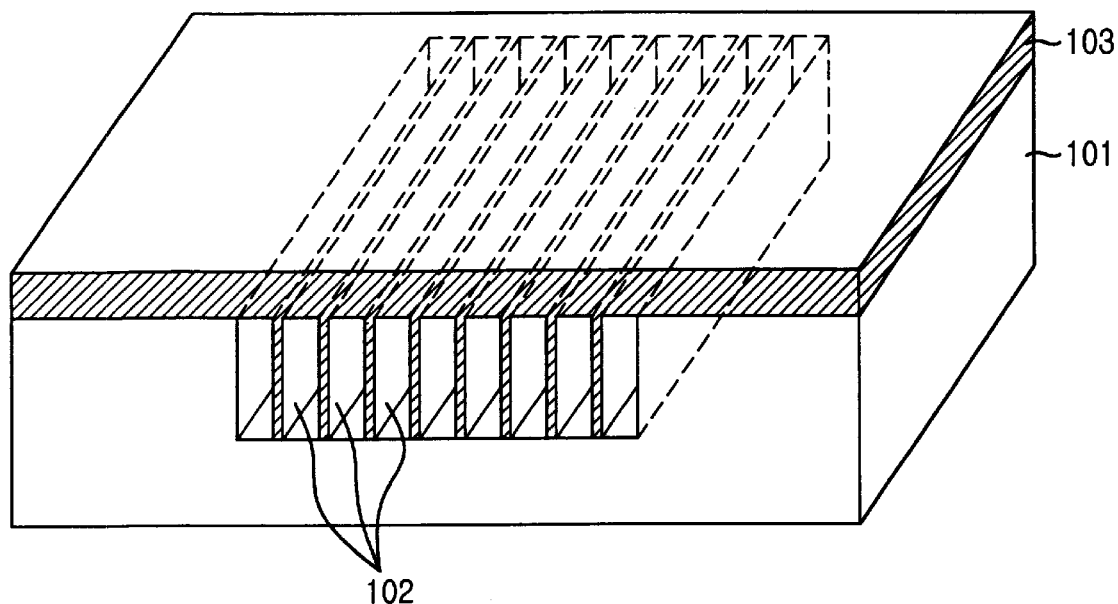
FIGS. 1A to 1D depict microchannel array structures in accordance with an embodiment of the present invention.
Figure 1B:
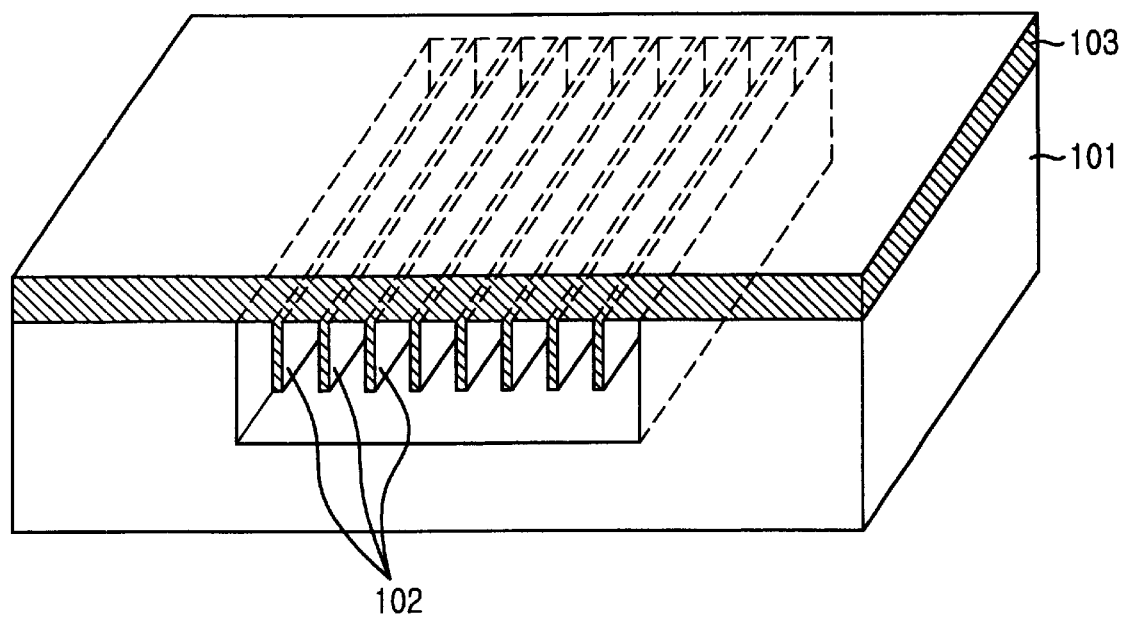
Figure 1C:
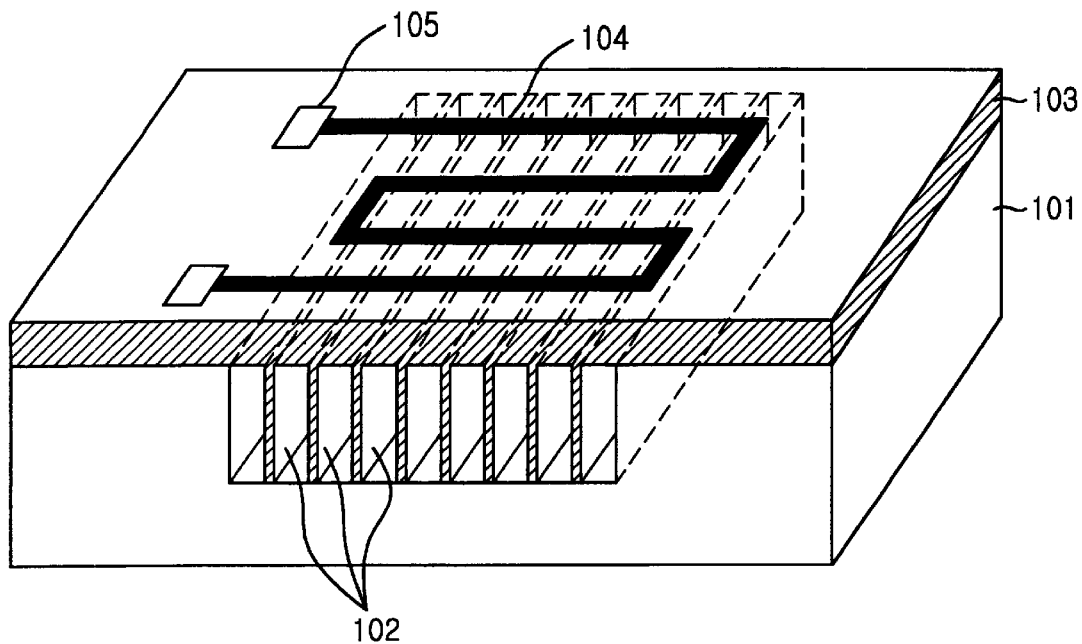
Figure 1D:
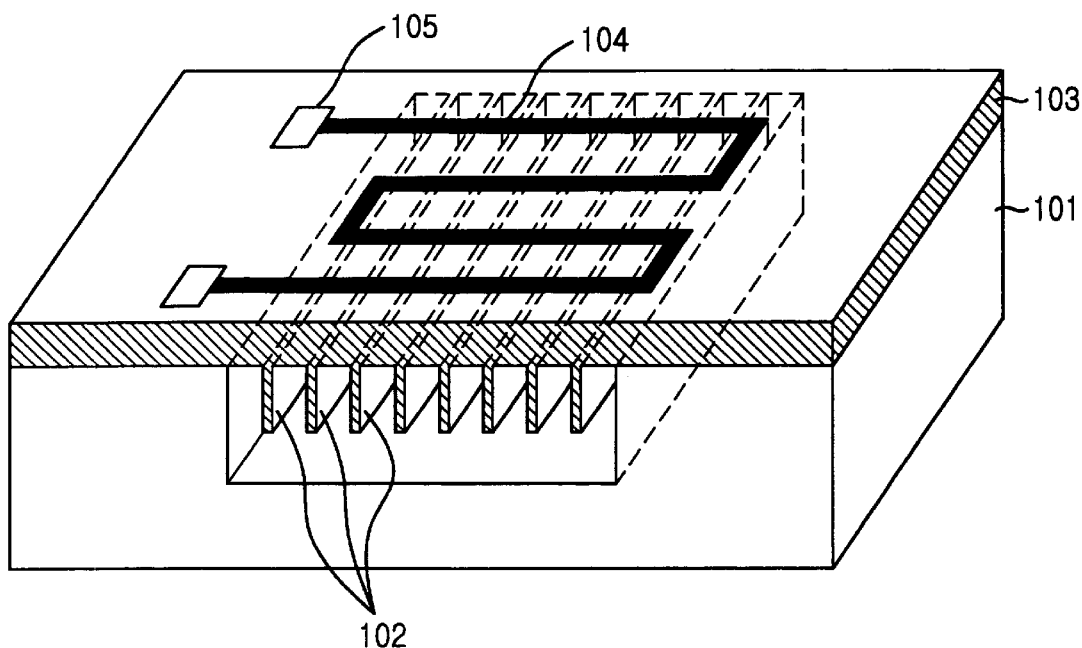

Other objects and aspects of the invention will become apparent from the following description of the embodiments with reference to the accompanying drawings, which is set forth hereinafter.

FIGS. 1A to 1D are schematics of a microchannel array structure which a micro heater or a micro electrode is integrated into in accordance with an embodiment of the present invention. The microchannel array structure of the present invention is fabricated by surface micromachining using CMOS semiconductor fabrication processes. Largely, the microchannel array structure has five sections: silicon substrates 101, 201, 301; microchannel arrays embedded therein 102, 202, 302; microchannel outer walls 103, 203, 303; a micro heater or a micro electrode 104, 214; and electrical pads 105, 215.

FIGS. 2A to 2I are cross-sectional views illustrating the method of fabricating a microchannel array structure in accordance with a preferred embodiment of the present invention. The whole process starts with a silicon wafer using one or three pieces of pattern masks, followed by the steps of forming silicon trench structures and trench thermal oxide layers, an outer wall and a heater or an electrode, then removing a sacrificial layer, and then forming pads for electric interconnection. With reference to FIG. 2, the embodiment of the present invention is described in detail, hereinafter.

Figure 2A:
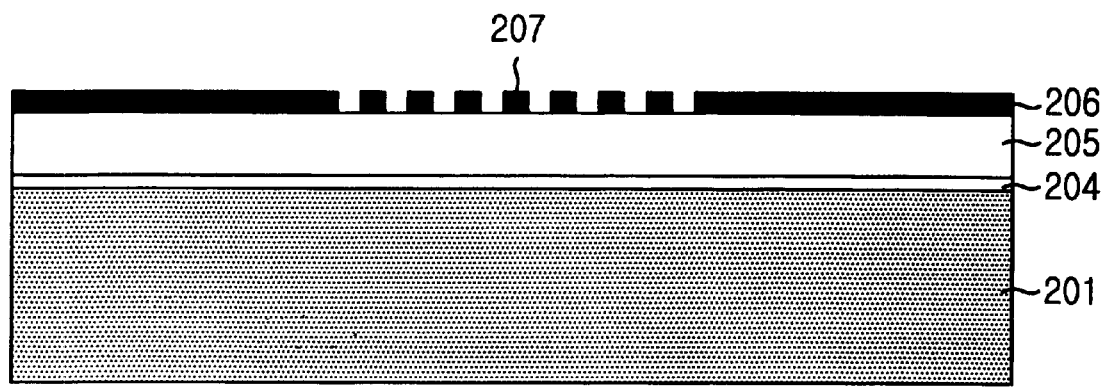
FIGS. 2A to 2I show cross-sectional views illustrating the fabrication method of a microchannel array structure in accordance with an embodiment of the present invention.

As shown in FIG. 2A, a five-inch and p-type silicon wafer is used as a substrate after going through the standard cleaning method, then a silicon nitride layer ($Si_3N_4$) (1000~2000 Å) 204 and a silicon oxide layer ($SiO_2$) (1000~8000 Å) 205 are deposited for masking, are grown up sequentially by being treated with LPCVD (low pressure chemical vapor deposition) or PECVD (plasma enhanced chemical vapor deposition). And then, a photoresist (PR) layer 206 is coated and exposed to UV light using a first mask, patterned and defined with a plurality of fine lines and spaces.

Figure 2B:
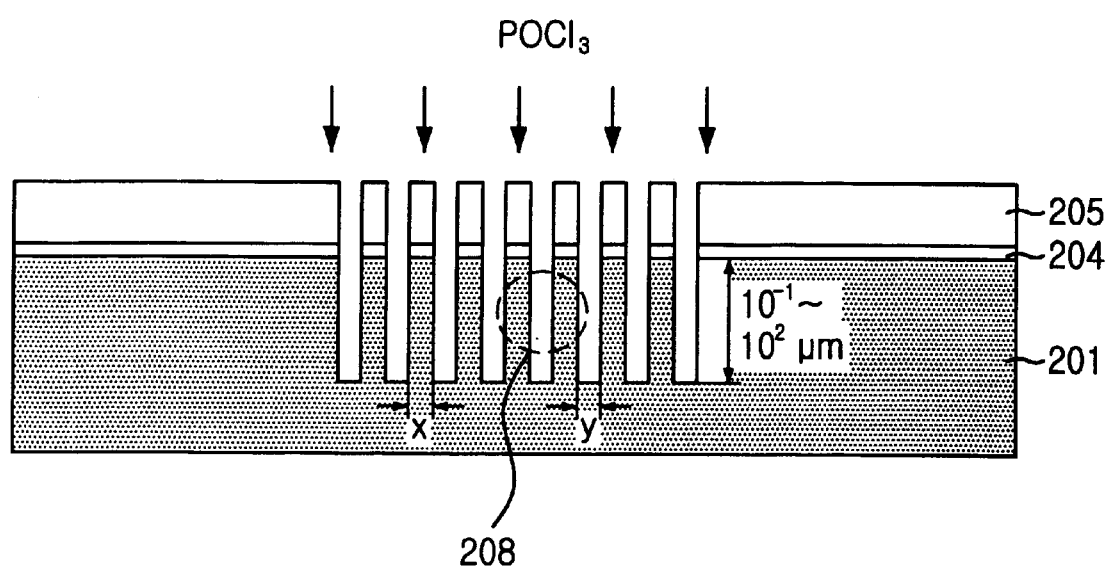
Figure 2C:
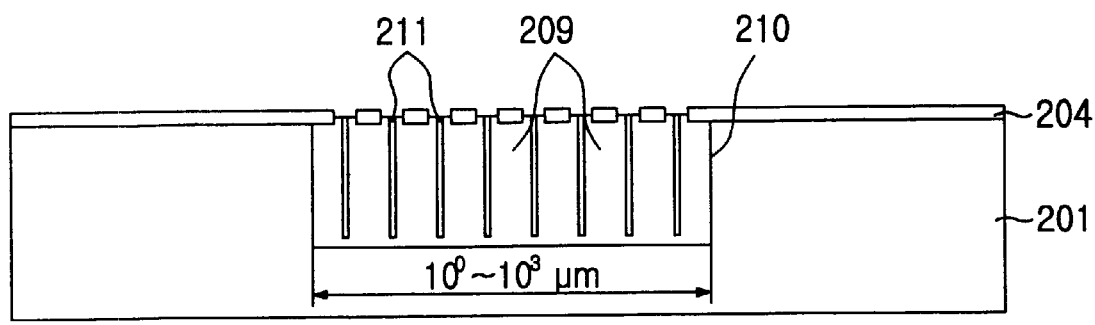

Referring to FIG. 2B, the PR 206 is removed after the masking layers of $SiO_2$ 205 and $Si_3N_4$ 204 for forming silicon trenches are dry-etched. The exposed silicon substrate 101, 201, 301 is dry-etched $10^{-1} \sim 10^2$ μm deep by reactive ion etching (RIE) or deep-RIE, so that silicon trench structures 208 are formed. It's advisable to set the x:y ratio of a line to a space at 0.45:>0.55, because it will form a micropore portion 211 between the trench thermal oxide layers 209 generated from silicon oxidation in the later procedure as shown in FIG. 2C. The shape of trench structures formed in the silicon substrate is not limited to the shape of lines and spaces, but it's possible to etch in any shapes, the planar structure of which shapes like slots or isolated columns, and cross-section of which shapes like polygons such as, squares, rounds, hemicycles, lozenges, trapezoids, triangles, hexagon and so forth. The silicon substrate 101, 201, 301 is doped into n-type with $POCl_3$ diffusion in a furnace at a temperature of 900° C. for 30 minutes. This procedure is meant to accelerate the thermal oxidation of the silicon trench structures 208 and to remove the P-containing trench thermal oxide layer 209 easily by HF etching during the steps of FIGS. 2C and 2F or 2I.

FIG. 2C shows procedures of removing the $SiO_2$ layer 205 with BHF solution, thermally oxidizing a plurality of $n^+$-doped silicon trench structures 208 in a furnace filled with $O_2$ or $H_2/O_2$ at a temperature of 900~1000° C., then converting them into trench thermal oxide layers 209, using the $Si_3N_4$ layer 204 as an oxidation mask. Then define a microchannel array formation region 210, of which the size is $10^0 \sim 10^3$ μm in a sectional width or diameter. Here, the micropore portion 211, whose width is variable between 0.2~1 μm according to the design condition, are formed simultaneously between the trench thermal oxide layers 209, the sacrificial layers.

Figure 2D:
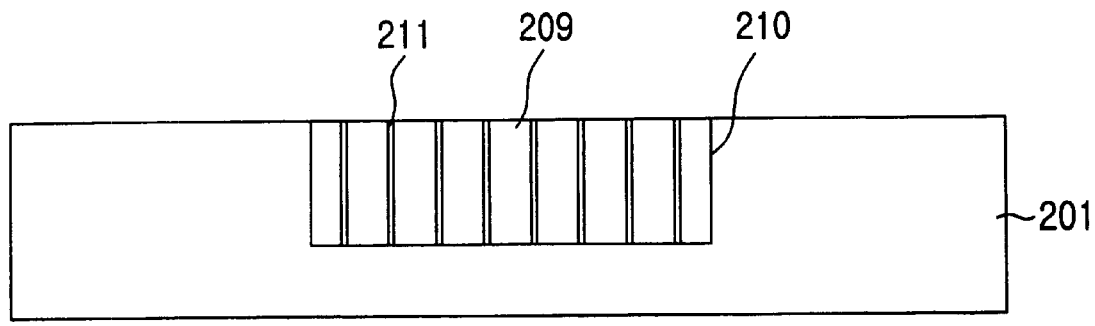

Referring to FIG. 2D, using the $Si_3N_4$ layer 204 as an etching mask, the trench thermal oxide layers 209 right below the micropore portion 211 are removed by dry-etching until the micropore portion 211 reaches the silicon substrates 101, 201, 301, and then the $Si_3N_4$ layer 204 is removed with $H_3PO_4$ solution.

Figure 2E:
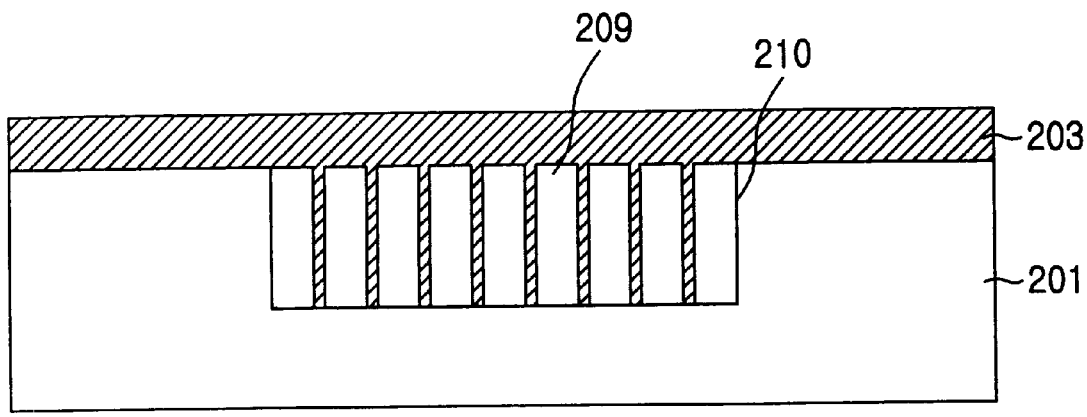

Meanwhile, in a bid to form a microchannel array structure where the lower part of the channel is open to each other, the step of FIG. 2C should be followed by the step of FIG. 2E, skipping the step of FIG. 2D. Figures of each procedures coming after now, however, will be described as ones gone through the step of FIG. 2D, for convenience.

FIG. 2E shows a polysilicon layer 103, 203, 303 which can be deposited over 0.4 $\mu$m-thick, more preferably over 1 $\mu$m-thick, by the LPCVD or PECVD technique according to the design condition. Here, the polysilicon layer fills the micropore portion 211 regularly arrayed in the silicon substrate, thereby forming a microchannel outer wall 103, 203, 303. After that, the compression stress within the polysilicon layer should be relieved by being heated it in a furnace filled with $N_2$ at 1000° C. for two hours. Here, the material for the microchannel outer wall is not confined to the polysilicon layer alone but other various thin films such as conducting layers, insulating ones, or semiconductor layers are available.

Figure 2F:
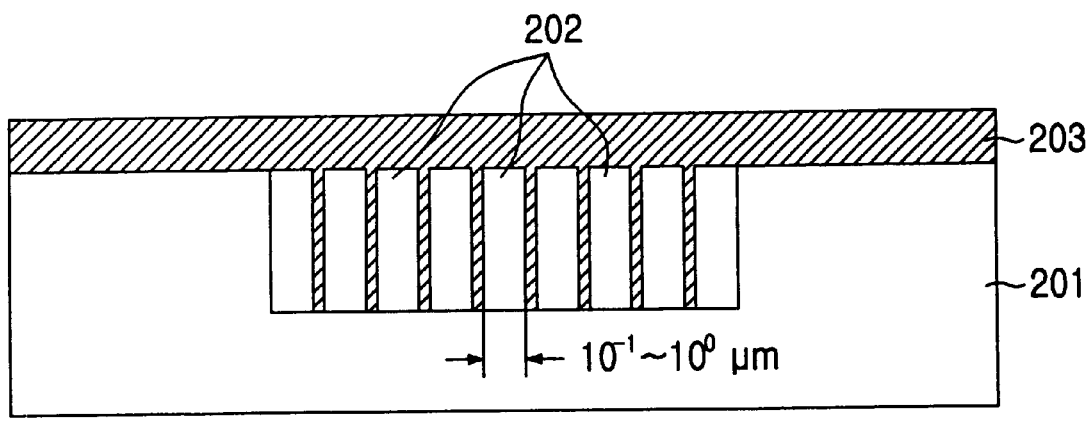

Referring to FIG. 2F, the trench thermal oxide layers 209 in the microchannel array formation region 210 can be removed either by wet etching using HF solution or gas-phase etching using anhydrous HF. By etching the sacrificial layer as above, a plurality of microchannels embedded in the silicon substrate can be formed and the upper part of it gets to have a planar structure.

Figure 2G:
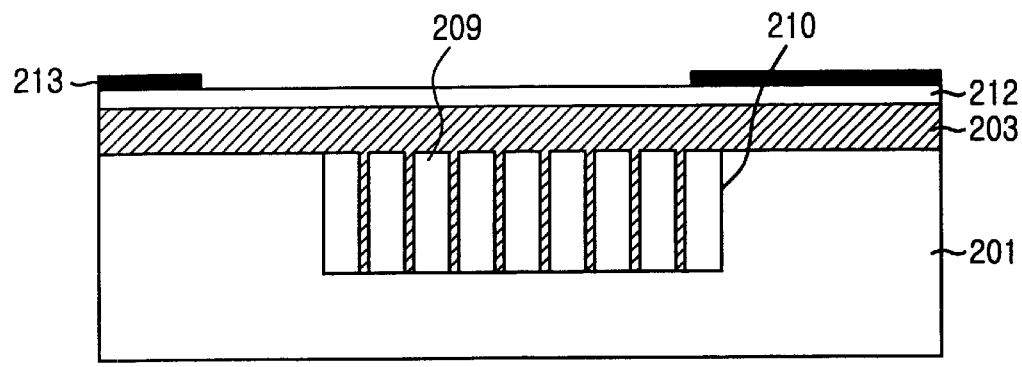
Figure 2H:
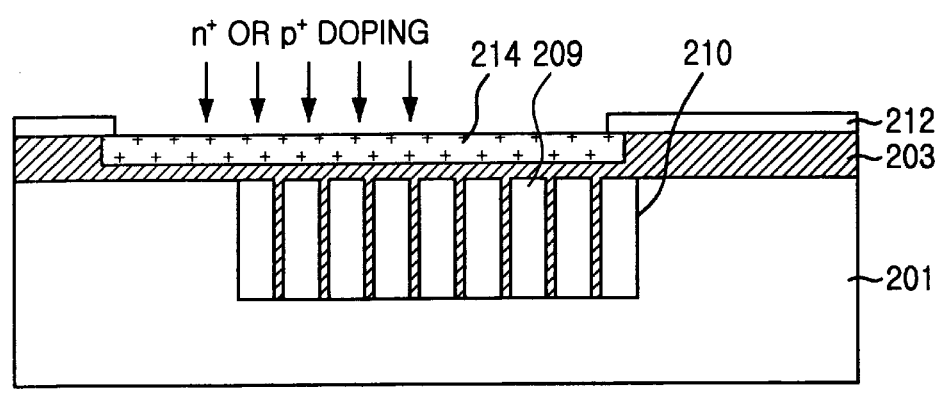
Figure 2I:
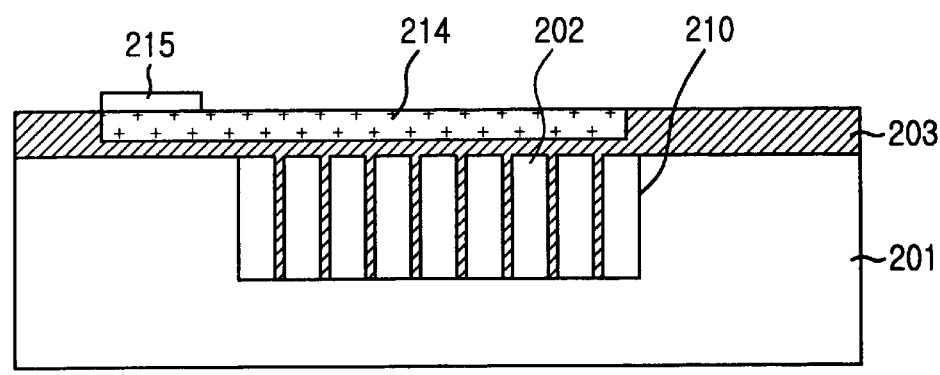

Meanwhile, in case of integrating an additional structure such as a micro heater or a micro electrode onto the top of the microchannel array of the present invention, the step of FIG. 2E should be directly followed by the steps of FIGS. 2G to 2I with the step of FIG. 2F being skipped.

As shown in FIG. 2G, when integrating a heater or an electrode onto the top of a microchannel array of the present invention, a $Si_3N_4$ or $SiO_2$ insulating layer 212 should be deposited for masking in a method of either LPCVD or PECVD prior to the PR 213, and then patterned by using a second mask, before the microchannel array is formed by etching out the sacrificial layer.

Referring to FIG. 2H, the microchannel outer wall, the polysilicon layers 103, 203, 303 is thermally treated after being locally doped with ion implant or furnace diffusion. Here, $n^+$ or $p^+$-doped polysilicon section 104, 214 becomes a buried heater 104, 214 by forming a diffused resistor. This material for a heater is not confined to the polysilicon layer. The heater can be formed by taking the patterning step after the deposition of an insulation layer 212 in FIG. 2G, and going into the procedure of depositing a number of conducting or semiconductor layers and then doing patterning. An electrode can be formed in the same way.

Referring to FIG. 2I, microchannel arrays 102, 202, 302 respectively embedded in the silicon substrate 101, 201, 301 is formed through the procedure of removing a plurality of trench thermal oxide layers 209 in the microchannel array formation region 210 by HF wet etching or gas-phase etching. The next step is to deposit a metal layer by sputtering or e-beam evaporation, apply a PR layer, do patterning with a third mask into a predetermined configuration and define pad regions 105, 215 for electric interconnection. Later on, through a procedure of removing the PR layer and metal alloying, microchannel array structures 102, 202, 302 with a micro heater or a micro electrode 104, 214 intergrated therein is completed.

Figure 3:
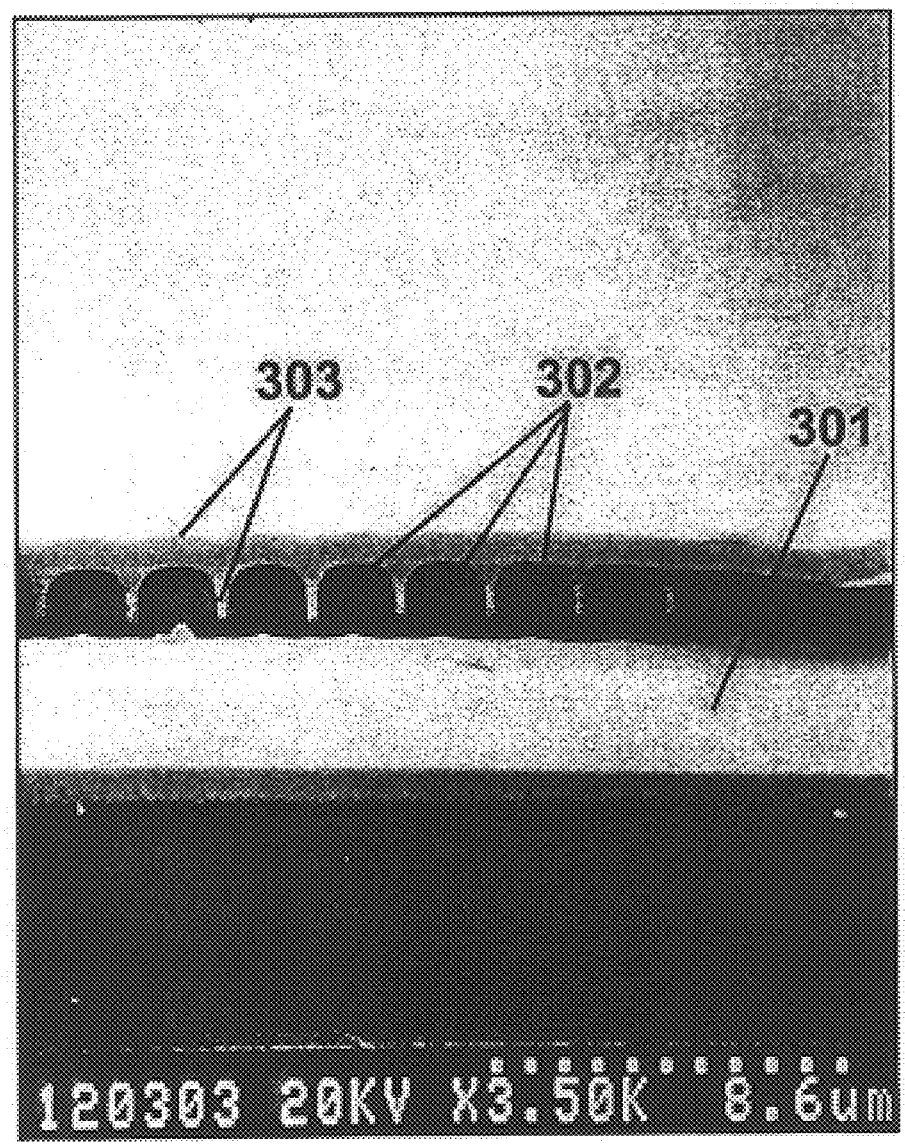
FIG. 3 is a photograph of a scanning electron micrograph of a cross-section of a microchannel array structure in accordance with the embodiment of the present invention.

FIG. 3 shows a scanning electron micrograph of a cross-section of the microchannel array structure 102, 202, 302 whose size is 100×100 $\mu m^2$. Inside the silicon substrates 101, 201, 301, ultra fine microchannels are formed 2.0 $\mu$m-pitch, 1.6 $\mu$m-wide and in an aspect ratio of 3 regularly, and the microchannel outer walls 103, 203, 303 are formed with a 1.0 $\mu$m-thick polysilicon layer deposited.

In accordance with the present invention, the region where a microchannel array structure will be formed is defined by forming the thermal oxide layers and the micropore portion through oxidizing a plurality of trench lines and spaces in a silicon substrate. Here, with the thermal oxidation process of semiconductors used, microchannels with fine width, or diameter, of $10^{-1}$~$10^0$ $\mu$m are formed. Thus, a microchannel structure is easily fabricated, wherein the sectional width, or diameter, of the whole channel array is $10^0$~$10^3$ $\mu$m. Also, it becomes possible to control the length and breadth ratio of a microchannel array as well as forming channel array deep into a substrate, because it's possible to etch $10^{-1}$~$10^2$ $\mu$m deep into a silicon substrate through RIE or deep-RIE technique during the trench formation. Further, it's possible to form microchannels in various polygons, since it's possible to etch shapes, of which the planar structure looks like slots or isolated columns, and of which the cross-section shapes like squares, rounds, hemicycles, lozenges, trapezoids, triangles, hexagon and so forth.

Adopting surface micromachining using silicon thermal oxide layers as a sacrificial layer and a polysilicon layer, as the microchannel outer wall, the fabrication method of the present invention hardly affects physical and chemical properties of the silicon substrate. Embedded in a substrate, the microchannel array gets to have planar surface, minimizing the effect from step height. So, additional structures such as passive components, micro sensors, micro actuators and electronic devices can be easily integrated on the top of the microchannel array structure through integrated CMOS semiconductor processing.

In accordance with the present invention, a polysilicon diffused resistor heater or a thin film heater is integrated onto the top of the microchannel outer wall. When an electric power is supplied, the generated heat can be promptly furnished to reagents, liquids or gases that pass through the inside of the microchannel array through a plurality of microchannel diaphragms of a radiation fin structure that includes a highly thermal-conductive polysilicon layer. The same principles are applied to freezing. Therefore, regardless of the kinds of the fluids inside a microchannel array, we can heat or freeze objects quickly.

After all, a microchannel array structure of the present invention can be used as FIGS. 1A to 1D shown, and be employed as a basic fluidic platform for miniaturizing and improving performances of electronic device coolers as well as fluidic micro-electro-mechanical system (MEMS) devices, e.g., bio-chips, microfluidic components and chemical analyzers, lab-on-a-chips, polymerase chain reaction (PCR) amplifiers, micro reactors and drug delivery systems.

While the present invention has been described with respect to certain preferred embodiment, it will be apparent to those skilled in the art that various changes and modifications may be made without departing from the scope of the invention as defined in the following claims.

What is claimed is:

1. A method of fabricating a microchannel array structure, the method comprising the steps of:
   a) forming a plurality of silicon trench structures by etching a silicon substrate;
   b) forming a plurality of trench thermal oxide layers and a micropore portion by oxidizing the silicon trench structures;

c) etching the trench thermal oxide layers under the micropore portion until the silicon interface;

d) forming a microchannel outer wall deposited planarily on the entire top of the substrate and buried into the micropore portion by being deposited with a deposition layer on the substrate; and e) forming a microchannel array by removing a plurality of the trench thermal oxide layers.

2. The method of fabricating a microchannel array structure of claim 1, further including the steps of:

f) forming a micro heater or a micro electrode by locally doping the top of the microchannel outer wall, or by depositing an additional thin layer on the outer wall or etching after the microchannel outer wall is formed; and g) forming electrical pads by depositing and etching a metal layer on the heater or the electrode.

3. The method of fabricating a microchannel array structure of claim 1, further including the step of impurity doping into the silicon substrate prior to oxidizing the silicon trench structures.

4. The method of fabricating a microchannel array structure of claim 1, further including the step of relieving the compression stress within the microchannel outer wall by conducting thermal treatment after the microchannel outer wall is deposited.

5. The method of fabricating a microchannel array structure of claim 1, wherein the step of forming the microchannel array by removing a plurality of trench thermal oxide layers is conducted by wet etching using HF solution or gas-phase etching using anhydrous HF gas.

* * * * *